United States Patent
Ramachandran et al.

(10) Patent No.: US 8,821,643 B2
(45) Date of Patent: Sep. 2, 2014

(54) IN-SITU CHAMBER CLEANING FOR AN RTP CHAMBER

(71) Applicants: Balasubramanian Ramachandran, Santa Clara, CA (US); Tae Jung Kim, Gyeonggi (KR); Jung Hoon Sun, Kyung-Gi do (KR); Joung Woo Lee, Singapore (SG); Hwa Joong Lim, Kyunggi-Do (KR); Sang Phil Lee, Kyounggi-Do (CN); Joseph M. Ranish, San Jose, CA (US)

(72) Inventors: Balasubramanian Ramachandran, Santa Clara, CA (US); Tae Jung Kim, Gyeonggi (KR); Jung Hoon Sun, Kyung-Gi do (KR); Joung Woo Lee, Singapore (SG); Hwa Joong Lim, Kyunggi-Do (KR); Sang Phil Lee, Kyounggi-Do (CN); Joseph M. Ranish, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/674,737

(22) Filed: Nov. 12, 2012

(65) Prior Publication Data

US 2013/0178072 A1 Jul. 11, 2013

Related U.S. Application Data

(63) Continuation of application No. 11/561,868, filed on Nov. 20, 2006, now abandoned.

(51) Int. Cl.
B08B 7/00 (2006.01)

(52) U.S. Cl.
USPC .................. 134/1.1; 134/1; 438/905

(58) Field of Classification Search
None
See application file for complete search history.

(56) References Cited

U.S. PATENT DOCUMENTS

| | | | | |
|---|---|---|---|---|
| 5,968,279 A | * | 10/1999 | MacLeish et al. | 134/1.2 |
| 5,983,906 A | * | 11/1999 | Zhao et al. | 134/1.1 |
| 6,236,023 B1 | * | 5/2001 | Savas et al. | 219/390 |
| 2003/0134459 A1 | * | 7/2003 | Tanaka et al. | 438/151 |

* cited by examiner

*Primary Examiner* — Nicole Blan
(74) *Attorney, Agent, or Firm* — Patterson & Sheridan, LLP

(57) ABSTRACT

A method of cleaning a chamber used for annealing doped wafer substrates. In one embodiment the method provides removing dopants deposited in an annealing chamber after an annealing process of a doped substrate by flowing one or more volatilizing gases into the annealing chamber, applying heat to volatilize the deposited dopants in the annealing chamber, and exhausting the chamber to remove volatilized dopants from the annealing chamber.

11 Claims, 3 Drawing Sheets

IN-SITU CHAMBER CLEANING FOR AN RTP CHAMBER

CROSS-REFERENCE TO RELATED APPLICATIONS

This application is a continuation application of co-pending U.S. patent application Ser. No. 11/561,868, filed on Nov. 20, 2006, which is herein incorporated by reference.

BACKGROUND OF THE INVENTION

1. Field of the Invention

Embodiments of the present invention generally relate to the fabrication of integrated circuits. More specifically, embodiments of the invention pertain to methods of removing residue from the interior surfaces of a substrate processing chamber.

2. Description of the Related Art

The manufacture of modern logic, memory, or linear integrated circuits (ICs) typically requires more than four hundred process steps. A number of these steps are thermal processes that raise the temperature of a semiconductor wafer to a target value to induce rearrangements in the atomic order or chemistry of thin surface films (e.g., diffusion, oxidation, recrystallization, salicidation, densification, flow).

Ion implantation is a preferred method for introduction of chemical impurities into semiconductor substrates to form the pn junctions necessary for field effect or bipolar transistor fabrication. Such impurities include p-type dopants such as boron (B), aluminum (Al), gallium (Ga), beryllium (Be), magnesium (Mg), and zinc (Zn) and N-type dopants such as phosphorus (P), arsenic (As), antimony (Sb), bismuth (Bi), selenium (Se), and tellurium (Te). Ion implantation of chemical impurities disrupts the crystallinity of the semiconductor substrate over the range of the implant. At low energies, relatively little damage occurs to the substrate. However, the implanted dopants will not come to rest on electrically active sites in the substrate. Therefore, an "anneal" is required to restore the crystallinity of the substrate and drive the implanted dopants onto electrically active crystal sites. As used herein, "annealing" refers to the thermal process of raising the temperature of an electrically inactive implanted region from an ambient temperature to a maximum temperature for a specified time and cooling to ambient temperatures for the purpose of creating electrically active regions in a device. The result of such annealing and/or the annealing process is sometimes also referred to as "implant annealing," "activation annealing," or "activation." Conventional thermal processes such as rapid thermal processing (RTP) and spike annealing are the main dopant activation methods.

During the processing of the wafer in, for example, an RTP chamber, the wafer may tend to outgas impurities implanted in the wafers. These outgassed impurities may be the dopant material, a material derived from the dopant material, or any other material that may escape the substrate during the annealing process, such as the sublimation of silicon. The outgassed impurities may deposit on the colder walls and on the reflector plate of the chamber. This deposition may interfere with temperature pyrometer readings and with the radiation distribution fields on the wafer, which in turn affects the temperature at which the wafer is annealed. Deposition of the outgassed impurities may also cause unwanted particles on the wafers and may also generate slip lines on the wafer. Depending on the chemical composition of the deposits, the chamber must be taken offline for a "wet clean" process after between about 200 and about 300 processed wafers. The wet clean process requires manual intervention to clean the deposited material from the chamber walls and from the reflector plate, which may be labor intensive and requiring the chamber to be offline for about four hours. There therefore exists a need for an automated method for removing deposits on the chamber walls and reflector plate to increase mean wafers between clean (MWBC).

SUMMARY OF THE INVENTION

The present invention generally provides a method of cleaning a chamber used for annealing doped wafer substrates. In one embodiment the method provides removing impurities deposited in an annealing chamber after an annealing process of a substrate by flowing one or more volatilizing gases into the annealing chamber, applying heat to volatilize the deposited impurities in the annealing chamber, and exhausting the chamber to remove volatilized impurities from the annealing chamber.

In one embodiment the method provides removing impurities deposited in an annealing chamber by providing the annealing chamber, introducing doped substrates into the annealing chamber, performing an annealing process of the doped substrates in the annealing chamber resulting in impurities being deposited in the annealing chamber, removing the doped substrates from the annealing chamber, and flowing one or more volatilizing gases into the annealing chamber and applying heat to volatilize the deposited impurities in the annealing chamber.

In one embodiment the method provides removing impurities deposited in an annealing chamber by providing the annealing chamber, introducing phosphorus doped substrates into the annealing chamber, performing an annealing process of the phosphorus doped substrates in the annealing chamber resulting in phosphorus dopant being deposited in the annealing chamber, removing the phosphorus doped substrates from the annealing chamber, flowing oxygen into the annealing chamber and applying heat to volatilize the deposited phosphorus dopant in the annealing chamber, exhausting the chamber to remove volatilized phosphorus dopant from the annealing chamber, and flowing an inert gas into the annealing chamber to remove oxygen from the annealing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The method of the present invention can be performed in an RTP chamber or any other chamber where materials deposit on the chamber walls or other parts of the chamber. An example of such an RTP system is the RADIANCE CENTURA® system commercially available from Applied Materials, InC, in Santa Clara, Calif.

Figure 1:
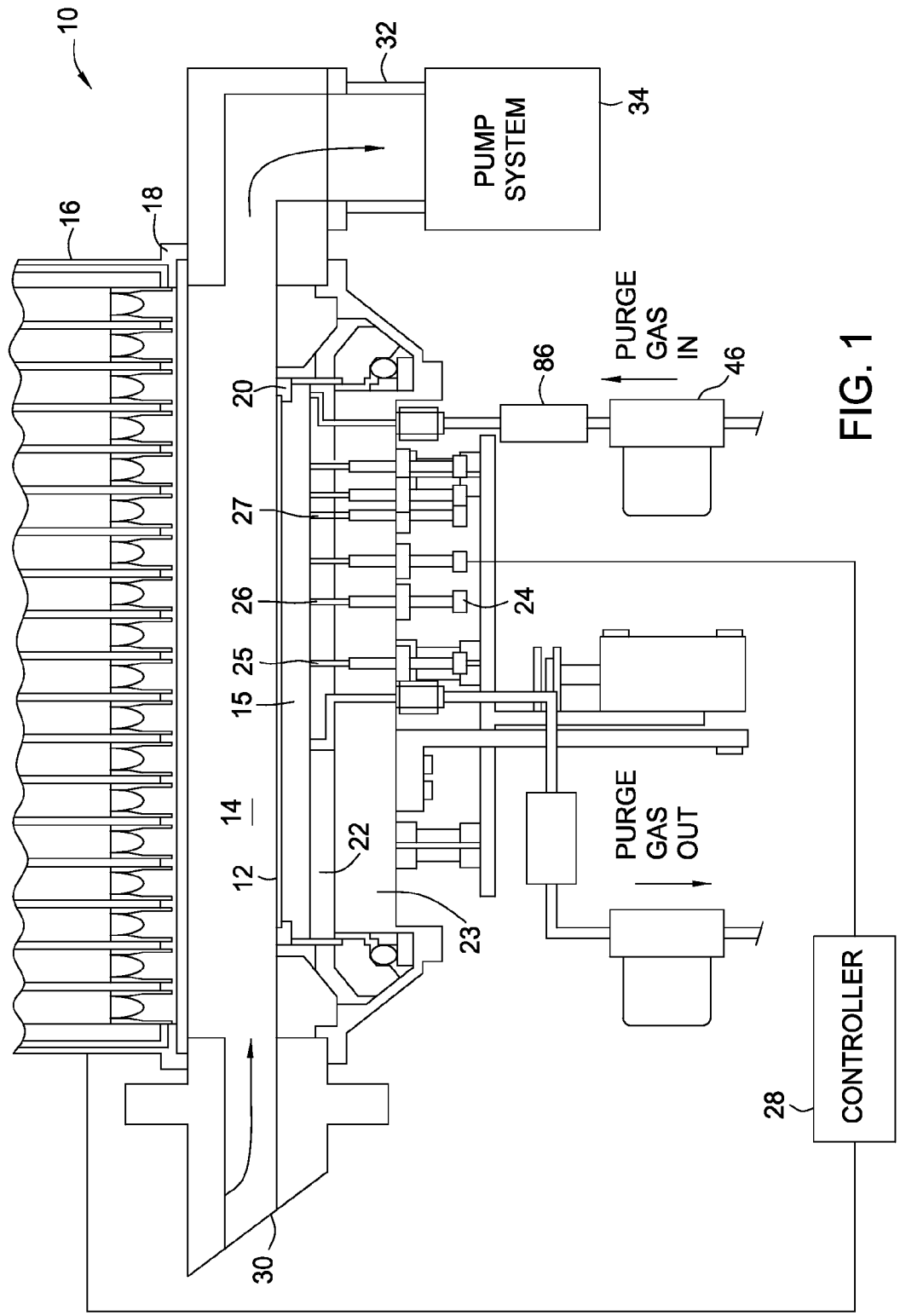
FIG. 1 is a view of a cross-section of a portion of an RTP system according to one embodiment of the present invention.

FIG. 1 illustrates a rapid thermal processing (RTP) system 10 including a processing chamber 14 for annealing a disk-shaped semiconductor substrate 12, according to one embodiment of the present invention. Chamber 14 is radiatively heated through a water-cooled quartz window 18 by a heating lamp assembly 16. The peripheral edge of substrate 12 is supported by a support structure 20, which optionally (not shown) can rotate at a rate of up to about 120 rpm (revolutions per minute). Beneath substrate 12 is a nickel-plated aluminum reflector plate assembly 22 that has an optically reflective coating facing the backside of substrate 12 to enhance the effective emissivity of substrate 12. The optically reflective coating is further described in commonly assigned U.S. Pat. No. 6,839,507, which description is incorporated by reference herein. Reflector plate assembly 22 is mounted on a water-cooled base 23. Cool down of substrates may be enhanced by increasing the cooling capacity of the water cooled base 23 and by locating the reflector plate assembly 22 closer to the water cooled base 23, as described in commonly assigned U.S. Pat. No. 6,897,131, which description is incorporated by reference herein. Furthermore, the optical coating may be enhanced to absorb radiated energy when the lamp assembly is off. Between the top surface of reflector plate assembly 22 and the backside of substrate 12 is a reflective cavity 15.

In a system designed for processing eight inch (200 mm) silicon wafers, reflector 22 has a diameter of about 8.9 inches, the separation between substrate 12 and the top surface of reflector 22 is about 5-10 mm, and the separation between substrate 12 and the bottom surface of quartz window assembly 18 is about 25 mm. In a system designed for processing twelve-inch (300 mm) silicon wafers, reflector 22 has a diameter of about 13 inches, the separation between substrate 12 and the top surface of reflector 22 is about 18 mm, and the separation between substrate 12 and the bottom surface of quartz window assembly 18 is about 30 mm.

The temperatures at localized regions of substrate 12 are measured by a plurality of temperature probes 24 that are positioned to measure substrate temperature at different radial locations across the substrate. Temperature probes 24 receive light from inside the processing chamber through optical ports 25, 26, 27, which extend through the top surface of reflector plate assembly 22. While processing system 10 typically may have about ten such temperature probes, only some of the probes are shown in FIG. 1. At the reflector plate surface, each optical port may have a diameter of about 0.08 inch. Sapphire light pipes deliver the light received by the optical ports to respective optical detectors (for example, pyrometers), which are used to determine the temperature at the localized regions of substrate 12. Temperature measurements from the optical detectors are received by a controller 28 that controls the radiative output of heating lamp assembly 16. The resulting feedback loop improves the ability of the processing system to uniformly heat substrate 12.

During an annealing processing, gases for the annealing ambient are introduced into processing chamber 14 through an ambient gas input 30. The ambient gases flow across the top surface of substrate 12 and may react with a heated substrate. Excess ambient gases, as well as any reaction by-products, are withdrawn from processing chamber 14 through an ambient gas output 32 by a pump system 34.

Most of the excess ambient gases and reaction products can be pumped out of processing chamber 14, but some volatile contaminants may leak into reflective cavity 15 and deposit onto the reflector plate and chamber walls. The rate at which volatile contaminants are deposited can be substantially reduced by a flow of a purge gas across the top surface of reflective plate assembly 22. Additionally a purge gas may be introduced into processing chamber 14 through input 46 which is connected to a filter 86.

Figure 2:
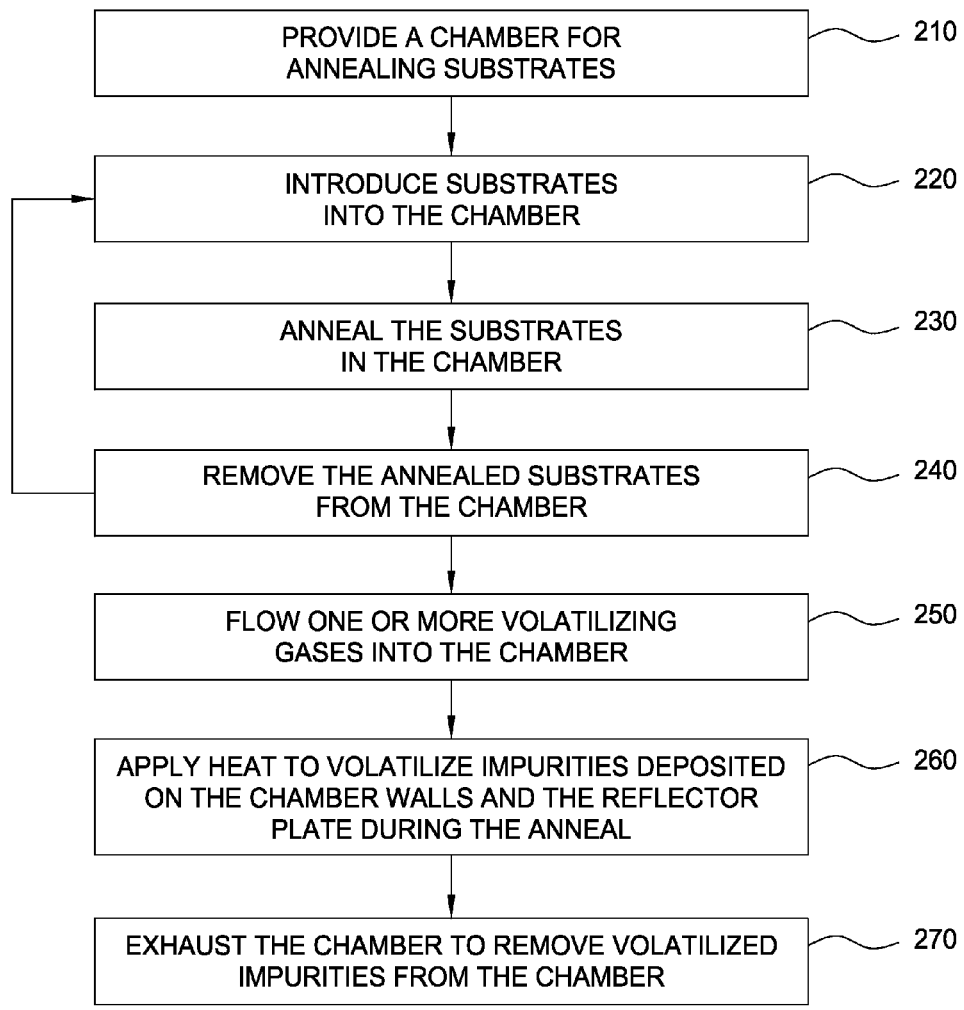
FIG. 2 is a process flow diagram illustrating a method for removing impurities deposited in an annealing chamber according to an embodiment of the invention.

FIG. 2 is a process flow diagram illustrating a method for removal of the volatile contaminants deposited on the chamber walls and on the reflector plate during the annealing process. In step 210, a chamber for annealing substrates such as doped semiconductor wafers is provided. One such chamber may be the RADIANCE CENTURA® system described above. The substrates are introduced into the chamber (step 220) and subjected to an anneal process (step 230). The substrates may be doped with p-type dopants such as boron (B), aluminum (Al), gallium (Ga), beryllium (Be), magnesium (Mg), and zinc (Zn) or N-type dopants such as phosphorus (P), arsenic (As), antimony (Sb), bismuth (Bi), selenium (Se), and tellurium (Te). The substrate wafers may be exposed to a annealing process such as a rapid thermal annealing (RTA) process lasting from about 2 seconds to about 20 seconds, preferably from about 5 seconds to about 10 seconds, as described in commonly assigned U.S. Pat. No. 7,078,302, which description is incorporated by reference herein. The RTA process heats the substrates to a temperature from about 800° C. to about 1,400° C., preferably from about 1,000° C. to about 1,200° C. For example, an RTA process heats the substrates to about 1,000° C. for about 5 seconds. The water cooled reflector plate is maintained at between about 150° C. and about 200° C. during the annealing process, preferably at about 180° C.

In step 240 the annealed substrate wafers are removed from the chamber. New substrate wafers may be introduced into the chamber and steps 220-240 repeated a number of times the method proceeds with step 250. In one embodiment steps 220-240 are repeated between about 10 times and about 100 times, preferably, between about 10 times and about 50 times. In one embodiment steps 220-240 repeated are repeated about 25 times. After each anneal impurities, such as dopants or sublimed silicon, may deposit onto the walls or surfaces of an RTP chamber.

In step 250 one or more volatilizing gases are introduced into the chamber. The one or more volatilizing gases may be any gas that can volatilize the compounds deposited on the walls or surfaces of an RTP chamber. The one or more volatilizing gases may include oxidizing gases and/or reducing gases. Suitable oxidizing gases include oxygen ($O_2$), ozone ($O_3$), nitrous oxide ($N_2O$), fluorine ($F_2$), chlorine ($Cl_2$), carbon monoxide (CO), carbon dioxide ($CO_2$), plasmas thereof, radicals thereof, derivatives thereof, and combinations thereof. Suitable reducing gases include silane ($SiH_4$), disilane ($Si_2H_6$), ammonia ($NH_3$), phosphine ($PH_3$), hydrazine ($N_2H_4$), diborane ($B_2H_6$), triethylborane ($Et_3B$), hydrogen ($H_2$), atomic hydrogen (H), plasmas thereof, radicals thereof, derivatives thereof, and combinations thereof. In one embodiment the one or more volatilizing gases may be oxygen.

Heat is provided to the chamber in step 260. The heat may be provided from a heating lamp assembly as depicted in FIG. 1, or from any other source, such as from a heat exchanger. The chamber may be heated to a temperature from about 800° C. to about 1,400° C., preferably from about 1,000° C. to about 1,200° C. The water cooled reflector plate is maintained at between about 150° C. and about 200° C., preferably at about 180° C. The volatilizing gases, in combination with the heat, reacts with the deposits on the chamber walls and reflector plate to form volatile products. The volatilization of the deposits may proceed for between about 1 minute to about 10 minutes, preferably between about 5 minutes and about 6 minutes. In step 270, the volatilized impurities are exhausted from the chamber. In one embodiment, the one or volatilizing gases may be introduced into the annealing chamber in a continuous manner, with the one or volatilizing gases being exhausted as more one or volatilizing gases is flowed into the annealing chamber. In another embodiment, the chamber may be filled with the one or volatilizing gases, the gas source turned off, and the chamber exhausted upon completion of the volatilization of the impurities.

A purging gas may be flowed into the chamber to promote the exhaustion of the volatilized impurities from the chamber. Any gas compatible with the substrates during the annealing process may be used as a purging gas, such as inert gases. Depending on the substrates being annealed suitable purging gases may be nitrogen, argon, carbon dioxide, helium, or combinations thereof. Heat may be provided during the purge process to prevent the volatilized impurities from redepositing onto the reflector plate and chamber walls. In one embodiment, the purging of the chamber may proceed for between about 1 minute to about 10 minutes, preferably between about 5 minutes and about 6 minutes.

EXAMPLE

Figure 3:
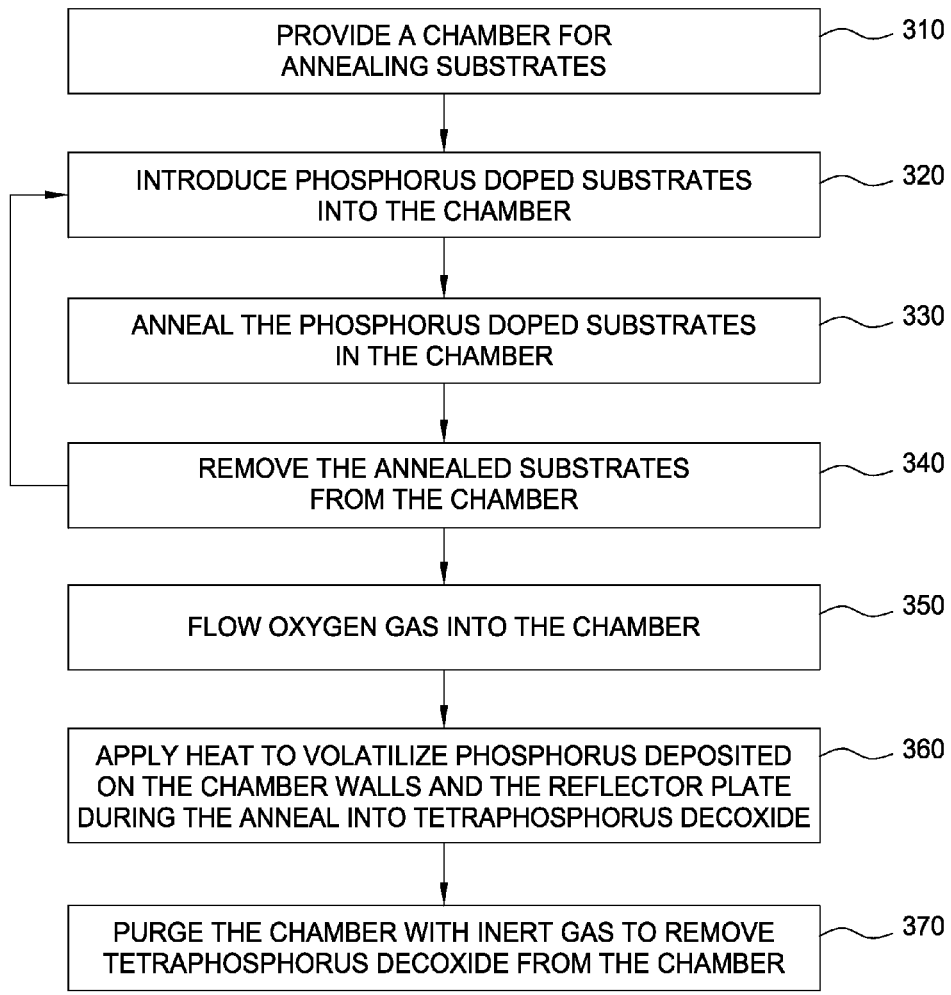
FIG. 3 is a process flow diagram illustrating a method for removing phosphorus dopants deposited in an annealing chamber according to an embodiment of the invention.

FIG. 3 is a process flow diagram illustrating a method for removal of the volatile contaminants deposited on the chamber walls and on the reflector plate during the annealing process, according to an embodiment of the invention. In this embodiment phosphorus doped substrate wafers are introduced into an annealing chamber (steps 310 and 320) and annealed (step 330) as described above in relation to step 230 in FIG. 1. Upon annealing of the phosphorus doped substrate wafers, the doped substrate wafers phosphorus may outgas phosphorus from the substrate wafers. This phosphorus may deposit on the colder walls and on the reflector plate of the chamber during the annealing. Conventionally, the annealing chamber requires a wet clean for about every 250 wafers annealed to remove the phosphorus and any other potential deposits. However, the number of mean wafers between clean (MWBC) can be dramatically increased by performing an "oxygen bake" of the chamber as described herein. After steps 320-340 have been repeated sufficient amount of times to anneal about 25 wafers, the chamber undergoes an oxygen bake wherein the chamber is flooded with oxygen gas (step 350) and heat applied (step 360) by the heating lamp assembly. The heated oxygen and phosphorus react in the chamber to form tetraphosphorus decoxide ($P_4O_{10}$), which at temperatures above 150° C. is volatile and can easily be exhausted. The chamber may be treated with the oxygen and heat for between about 1 minute and about 10 minutes. In one embodiment, the chamber is treated for about 6 minutes. Upon completion of the conversion of phosphorus to tetraphosphorus decoxide, the nitrogen gas is used as a purge gas to evacuate the volatilized tetraphosphorus decoxide from the chamber (step 370). The chamber may be flooded with the nitrogen gas under heat for between about 1 minute and about 10 minutes. In one embodiment the chamber is flooded with nitrogen for about 6 minutes. In addition to evacuating volatilized tetraphosphorus decoxide, the purge gas may also purge oxygen from the chamber, as some semiconductor substrates may be sensitive to oxygen.

The oxygen bake of the annealing chamber for every 25 wafers annealed drastically limits the need for chamber down times for wet cleans. By performing an oxygen bake for every 25 wafers annealed the chamber may need a wet clean after about 5000 wafers annealed, as opposed to for every about 250 wafers annealed without the oxygen bake. The increased mean wafers between clean (MWBC) results in less resources needed to perform the wet cleans, and thus increased efficiency in the annealing process can be obtained.

While the foregoing is directed to embodiments of the present invention, other and further embodiments of the invention may be devised without departing from the basic scope thereof, and the scope thereof is determined by the claims that follow.

The invention claimed is:

1. A method of removing impurities deposited in an annealing chamber, comprising:
introducing phosphorus doped substrates into the annealing chamber;
performing an annealing process of the phosphorus doped substrates in the annealing chamber, wherein the annealing process results in phosphorus dopant being deposited on surfaces of the annealing chamber;
removing the phosphorus doped substrates from the annealing chamber;
flooding the chamber with a volatilizing gas consisting of oxygen or oxygen with an inert gas to contact the surfaces of the annealing chamber, wherein the oxygen reacts with the phosphorus dopant to form a volatile product comprising the phosphorus dopant;
applying heat to volatilize the volatile product comprising the phosphorus dopant deposited on the surfaces of the annealing chamber during absence of phosphorus doped substrates;
exhausting the chamber to remove volatilized phosphorus dopant from the annealing chamber; and
flowing an inert gas into the annealing chamber to remove the volatilizing gas from the annealing chamber.

2. The method of claim 1, wherein the volatilizing gas flows in a continuous manner to form a volatile product comprising the phosphorus dopant.

3. The method of claim 1, wherein the annealing process is performed on between about 10 phosphorus doped substrates and about 50 phosphorus doped substrates before the volatilizing gas is delivered to the surfaces of the annealing chamber.

4. The method of claim 3, wherein the annealing process is performed on about 25 phosphorus doped substrates before the volatilizing gas is delivered to the surfaces of the annealing chamber.

5. The method of claim 3, wherein the surfaces of the annealing chamber are exposed to the volatilizing gas for between about 1 minute and 10 minutes.

6. A method of removing impurities deposited in an annealing chamber, comprising:
introducing phosphorus doped substrates into the annealing chamber;
performing an annealing process of the phosphorus doped substrates in the annealing chamber, wherein the annealing process results in phosphorus dopant being deposited on surfaces of the annealing chamber;
removing the phosphorus doped substrates from the annealing chamber;
flooding the chamber with a volatilizing gas consisting of an oxidizing gas or the oxidizing gas with an inert gas to contact the surfaces of the annealing chamber, wherein the oxidizing gas reacts with the phosphorus dopant to form a volatile product comprising the phosphorus dopant;

applying heat to volatilize the volatile product comprising the phosphorus dopant deposited on the surfaces of the annealing chamber during absence of phosphorus doped substrates;

exhausting the chamber to remove volatilized phosphorus dopant from the annealing chamber; and flowing an inert gas into the annealing chamber to remove the volatilizing gas from the annealing chamber.

7. The method of claim 6, wherein the volatilizing gas flows in a continuous manner to form a volatile product comprising the phosphorus dopant.

8. The method of claim 6, wherein the annealing process is performed on between about 10 phosphorus doped substrates and about 50 phosphorus doped substrates before the volatilizing gas is delivered to the surfaces of the annealing chamber.

9. The method of claim 8, wherein the annealing process is performed on about 25 phosphorus doped substrates before the volatilizing gas is delivered to the surfaces of the annealing chamber.

10. The method of claim 8, wherein the surfaces of the annealing chamber are exposed to the volatilizing gas for between about 1 minute and 10 minutes.

11. The method of claim 6, wherein the oxidizing gas is selected from the group consisting of oxygen ($O_2$), ozone ($O_3$), nitrous oxide ($N_2O$), carbon monoxide (CO), carbon dioxide ($CO_2$), plasmas thereof, radicals thereof, and combinations thereof.

* * * * *

UNITED STATES PATENT AND TRADEMARK OFFICE
CERTIFICATE OF CORRECTION

PATENT NO.        : 8,821,643 B2                                      Page 1 of 1
APPLICATION NO.   : 13/674737
DATED             : September 2, 2014
INVENTOR(S)       : Ramachandran et al.

It is certified that error appears in the above-identified patent and that said Letters Patent is hereby corrected as shown below:

Title Page, (71) Applicants:

Please delete "Balasubramanian Ramachandran, Santa Clara, CA (US); Tae Jung Kim, Gyeonggi (KR); Jung Hoon Sun, Kyung-Gi do (KR); Joung Woo Lee, Singapore (SG); Hwa Joong Lim, Kyunggi-Do (KR); Sang Phil Lee, Kyounggi-Do (CN); Joseph M. Ranish, San Jose, CA (US)" and insert --Applied Materials, Inc., Santa Clara, CA (US)-- therefor;

Title Page, (72) Inventors:

Please delete "Kyounggi-Do (CN)" and insert --Kyounggi-Do (KR)-- therefor.

Signed and Sealed this
Eighteenth Day of August, 2015

Michelle K. Lee
*Director of the United States Patent and Trademark Office*

UNITED STATES PATENT AND TRADEMARK OFFICE
CERTIFICATE OF CORRECTION

PATENT NO. : 8,821,643 B2  
APPLICATION NO. : 13/674737  
DATED : September 2, 2014  
INVENTOR(S) : Ramachandran et al.

Page 1 of 1

It is certified that error appears in the above-identified patent and that said Letters Patent is hereby corrected as shown below:

Title Page,
Item [71], Applicant, "Applied Materials, Inc., Santa Clara, CA (US)" (as corrected on title page of patent in the Certificate of Correction issued August 18, 2015) is deleted and patent is returned to its original state in which Title Page, Item [71] should read:

--(71) Applicants: Balasubramanian Ramachandran, Santa Clara, CA (US); Tae Jung Kim, Gyeonggi (KR); Jung Hoon Sun, Kyung-Gi do (KR); Joung Woo Lee, Singapore (SG); Hwa Joong Lim, Kyunggi-Do (KR); Sang Phil Lee, Kyounggi-Do (CN); Joseph M. Ranish, San Jose, CA (US)--.

Signed and Sealed this
Fifteenth Day of March, 2016

Michelle K. Lee
*Director of the United States Patent and Trademark Office*